(12) United States Patent
Eckert et al.

(10) Patent No.: US 9,244,106 B2
(45) Date of Patent: Jan. 26, 2016

(54) METHOD AND DEVICE FOR MEASURING THE PHASE-NOISE SPECTRUM OF A PULSED SINUSOIDAL SIGNAL

(75) Inventors: Hagen Eckert, Mering (DE); Martin Weiss, Holzkirchen (DE); Wolfgang Wendler, Groebenzell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 435 days.

(21) Appl. No.: 13/883,727

(22) PCT Filed: Jan. 5, 2012

(86) PCT No.: PCT/EP2012/050118
§ 371 (c)(1),
(2), (4) Date: May 6, 2013

(87) PCT Pub. No.: WO2012/113585
PCT Pub. Date: Aug. 30, 2012

(65) Prior Publication Data
US 2013/0221946 A1    Aug. 29, 2013

(30) Foreign Application Priority Data

Feb. 23, 2011  (DE) .......................... 10 2011 004 572

(51) Int. Cl.
*G01R 29/26*  (2006.01)
*G01R 29/18*  (2006.01)
(Continued)

(52) U.S. Cl.
CPC ................ *G01R 29/26* (2013.01); *G01R 29/18* (2013.01); *G01R 19/2513* (2013.01); *G01R 25/00* (2013.01); *G01R 29/16* (2013.01)

(58) Field of Classification Search
CPC .... G01R 25/00; G01R 19/2513; G01R 29/16; G01R 29/18
USPC .............................................. 327/156; 324/86
See application file for complete search history.

(56) References Cited

U.S. PATENT DOCUMENTS 5,001,660 A * 3/1991 Adcock .................... H03D 7/00
                                                          708/270
5,508,605 A   4/1996 Lo
(Continued)

FOREIGN PATENT DOCUMENTS

DE   102005017217 A1   11/2005
EP       0651259 B1     5/1995
(Continued)

OTHER PUBLICATIONS

International Preliminary Report on Patentability and Written Opinion mailed Aug. 27, 2013, issued in corresponding International Application No. PCT/EP2012/050118, filed Jan. 5, 2012, 6 pages.
(Continued)

*Primary Examiner* — Jermele M Hollington
*Assistant Examiner* — Christopher McAndrew
(74) *Attorney, Agent, or Firm* — Christensen O'Connor Johnson Kindness PLLC

(57) ABSTRACT

A device for measuring the phase-noise spectrum of a pulsed sinusoidal signal generates a pulsed sinusoidal signal, converts the analog pulsed sinusoidal signal into a corresponding digital, pulsed sinusoidal signal and mixes the digital, pulsed sinusoidal signal into the baseband by means of quadrature mixing. Following this, the phase of the pulsed sinusoidal signal in the baseband is determined by means of Fourier transform of the phase of the pulsed sinusoidal signal, the phase spectrum of the pulsed sinusoidal signal is determined, and the phase-noise spectrum of the pulsed sinusoidal signal is determined by removing the spectral lines associated with the sinusoidal signal from the phase spectrum. According to the invention, the pulse pauses are removed from the pulsed sinusoidal signal in the baseband.

12 Claims, 9 Drawing Sheets

(51) Int. Cl.
*G01R 19/25* (2006.01)
*G01R 29/16* (2006.01)
*G01R 25/00* (2006.01)

(56) References Cited

U.S. PATENT DOCUMENTS

| | | | |
|---|---|---|---|
| 5,557,196 A | 9/1996 | Ujiie | |
| 5,881,107 A * | 3/1999 | Termerinac | H04L 27/2082 329/304 |
| 6,248,071 B1 * | 6/2001 | Lin | G01S 7/52023 600/443 |
| 7,224,752 B2 * | 5/2007 | Sugar | H04W 16/14 375/224 |
| 7,756,487 B2 * | 7/2010 | Lerner | H03B 21/02 324/76.19 |
| 7,805,122 B2 * | 9/2010 | Lerner | H03B 21/00 327/156 |
| 8,830,107 B1 * | 9/2014 | Karthaus | H03M 3/41 327/557 |
| 2003/0198304 A1 * | 10/2003 | Sugar | H04W 16/14 375/340 |
| 2004/0028123 A1 * | 2/2004 | Sugar | H04L 1/1664 375/224 |
| 2004/0156440 A1 * | 8/2004 | Sugar | H04W 16/14 375/259 |
| 2005/0002473 A1 * | 1/2005 | Kloper | G01R 23/16 375/316 |
| 2005/0238094 A1 | 10/2005 | Bessho | |
| 2006/0195501 A1 * | 8/2006 | Feldhaus | G01R 29/26 709/400 |
| 2007/0103230 A1 * | 5/2007 | Williams | H03F 3/217 330/10 |
| 2007/0142019 A1 * | 6/2007 | Mattisson | H03D 7/1441 455/327 |
| 2008/0036573 A1 * | 2/2008 | Tsukamoto | G06K 7/0008 340/10.2 |
| 2008/0177490 A1 * | 7/2008 | Feldhaus | G01R 23/16 705/75 |
| 2010/0080270 A1 * | 4/2010 | Chen | H04L 27/0008 375/219 |
| 2010/0080274 A1 | 4/2010 | Ishida | |
| 2011/0267222 A1 * | 11/2011 | Craig | G01S 13/878 342/25 B |
| 2014/0077849 A1 * | 3/2014 | Chen | H03L 7/08 327/156 |

FOREIGN PATENT DOCUMENTS

| | | |
|---|---|---|
| EP | 1892533 A1 | 2/2008 |
| KR | 20030044105 A | 6/2003 |
| WO | 2008110237 A1 | 9/2008 |

OTHER PUBLICATIONS

International Search Report mailed Apr. 10, 2012, issued in corresponding International Application No. PCT/EP2012/050118, filed Jan. 5, 2012, 3 pages.

* cited by examiner

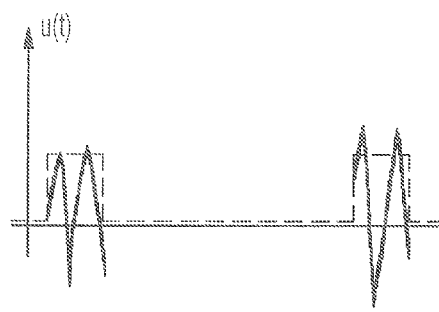
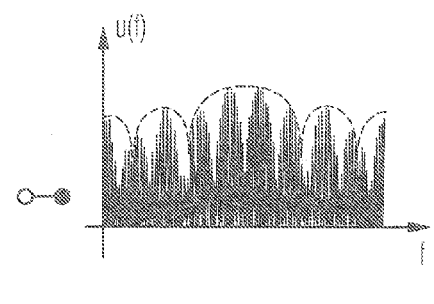
Fig. 4A  Prior art  Fig. 4B
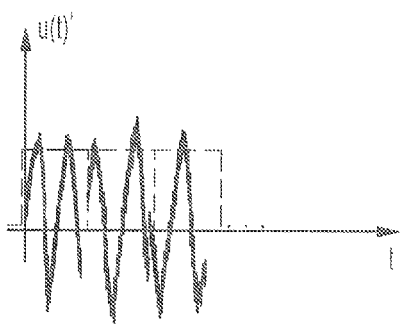
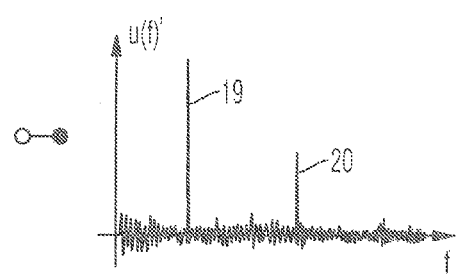
Fig. 5A  Fig. 5B
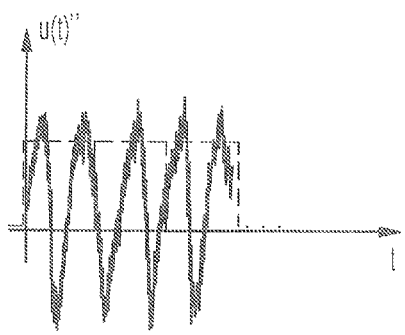
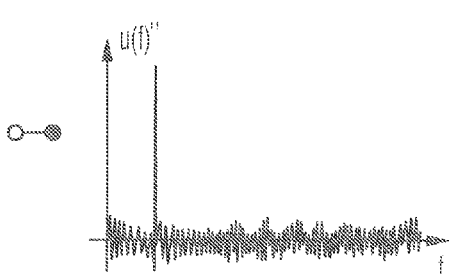
Fig. 6A  Fig. 6B

METHOD AND DEVICE FOR MEASURING THE PHASE-NOISE SPECTRUM OF A PULSED SINUSOIDAL SIGNAL

The invention relates to a method and a device for measuring the phase-noise spectrum of a pulsed sinusoidal signal.

DE 10 2005 017 217 A1 discloses a method for measuring the phase-noise of a non-pulsed sinusoidal signal. Pulsed sinusoidal signals are used by preference, for example, in radar technology. Accordingly, a high-frequency sinusoidal signal is generated by an oscillator, and a lower-frequency pulsed signal is generated by a pulse generator. The high-frequency sinusoidal signal is modulated with the lower-frequency pulsed signal in a pulse modulator in order to generate the pulsed sinusoidal signal.

FIG. 1 shows an arrangement previously used internally by the applicant to increase understanding of the measures according to the invention. However, this has not been accessible to the public and therefore does not represent a prior art. A pulsed sinusoidal signal, of which the phase-noise is to be determined, is generated in a signal source 1. The signal source 1 comprises: an oscillator 2, which generates a high-frequency sinusoidal signal; a pulse generator 3, which generates a lower-frequency pulsed signal; and a pulse modulator 4, which modulates the high-frequency sinusoidal signal with the lower-frequency pulsed signal.

The pulsed sinusoidal signal is supplied to the input of a phase detector 5 which is realised as a mixer. The other input of the phase detector 5 is supplied with a reference signal generated in a reference source. The reference source 6 is structured in a similar manner to the signal source and comprises: an oscillator 7 controllable in its frequency and phase, which generates a high-frequency reference sinusoidal signal; the same pulse generator 3, which generates the identical low-frequency pulsed signal; and a pulse modulator 8 which modulates the high-frequency reference sinusoidal signal with the lower-frequency pulsed signal. The frequency and phase control of the oscillator 7, which is controllable in its frequency and phase, is implemented via a PLL phase-locked loop comprising a PLL controller 9, which generates a controller signal for controlling the oscillator 7, which is controllable in its frequency and phase dependent upon the output signal of the phase detector 5, so that the carrier frequency of the high-frequency pulsed sinusoidal signal and of the high-frequency reference sinusoidal signal are identical, and the phases of the high-frequency pulsed sinusoidal signal and of the high-frequency reference sinusoidal signal are orthogonal to one another.

As a result of mixing the high-frequency pulsed sinusoidal signal and the high-frequency reference sinusoidal signal in each case with an identical carrier frequency, a signal component, which is removed by a low pass filter 10 connected downstream of the phase detector 5, occurs at double the carrier frequency, and a signal component occurs at the frequency zero. The signal component at the zero frequency of the mixer output signal which now contains only the noise signal component of the pulsed sinusoidal signal is pursued further in order to determine the phase-noise in the pulsed sinusoidal signal.

The analog phase-locked loop (Phase Locked Loop (PLL)) requires a time-consuming capture of the frequency of the high-frequency reference sinusoidal signal generated by the reference source 6 relative to the frequency of the high-frequency pulsed signal generated by the signal source 1 and a preliminary standardisation measurement. The measurement time for the phase-noise measurement is unnecessarily prolonged as a result of this preliminary standardisation measurement. Added to this is the fact that a pulsed sinusoidal signal u(t) with superposed noise according to FIG. 4A leads to a spectrum U(f) according to FIG. 4B, which, alongside the noise spectral component, provides a plurality of spectral lines, which correspond to the pulsed sinusoidal payload-signal component in the time domain. These spectral lines associated with the payload-signal component of the signal to be measured interfere with an analysis of the phase-noise spectrum.

The object of the invention is therefore to provide a method and a device for phase-noise measurement of a pulsed sinusoidal signal which, on the one hand, provide a minimal measurement time and, on the other hand, which are free of payload-signal spectral components in the phase-noise spectrum.

The object is achieved by a method for measuring the phase-noise spectrum of a pulsed sinusoidal signal with the features of claim 1 and by a device according to the invention for measuring the phase-noise spectrum of a pulsed sinusoidal signal with the features of claim 7. Advantageous further technical developments are derived from the respectively dependent claims.

According to the invention, the analog phase-noise measurement by means of PLL phase-locked loop is replaced by a digital phase-noise measurement, in which, after it has been generated, the pulsed sinusoidal signal is converted into the digital data format by analog-digital conversion and mixed into the baseband by quadrature mixing. The quadrature mixing realises a pulsed sinusoidal signal in the baseband, which, with its in-phase and quadrature component, represents a complex baseband signal, from which the associated phase of the pulsed sinusoidal signal in the baseband is determined in a relatively simple manner—for example, by means of a Coordinate Rotation Digital Computer (Cordic) module. The phase spectrum of the pulsed sinusoidal signal is determined from the phase of the pulsed sinusoidal signal in the baseband by means of discrete Fourier transform. The phase-noise spectrum signal is determined by removing the spectral lines associated with the sinusoidal payload signal from the phase spectrum.

According to the invention, the pulse pauses are additionally removed from the pulsed sinusoidal signal in the baseband after the quadrature mixing. In this manner, the pulsed sinusoidal signal is converted into a sinusoidal signal, which may, under some circumstances provide instabilities only at the transition points of the original pulses. The associated spectrum and accordingly the phase-noise spectrum of a pulsed sinusoidal signal with pulse pauses eliminated therefore now only provides the spectral lines at the positive and negative frequency of the sinusoidal signal, the noise spectrum of the superposed noise signal and Dirac impulses resulting from instabilities in the signal course of the pulsed sinusoidal signal with pulse pauses eliminated.

In a first embodiment of the invention, the pulse pauses are removed from the pulsed sinusoidal signal in the baseband through a time displacement of the end of the respectively preceding pulse to the beginning of the respectively following pulse.

In a second embodiment of the invention, the pulse pauses are removed from the pulsed sinusoidal signal in the baseband according to the displacement law for spectral transformations through a phase displacement corresponding to the time displacement of the individual pulses of the spectra associated respectively with the individual pulses.

In a first sub-embodiment of the invention, Dirac impulses in the phase-noise spectrum resulting from instabilities in the signal course of the pulsed sinusoidal signal with pulse pauses eliminated are identified and removed from the phase-noise spectrum through interpolation of the respectively adjacent spectral values of the phase-noise spectrum.

In a second sub-embodiment of the invention, Dirac impulses in the phase-noise spectrum resulting from instabilities in the signal course of the pulsed sinusoidal signal with pulse pauses eliminated are removed by shortening the respectively following pulse of the pulsed sinusoidal signal with pulse pauses eliminated at its beginning or by shortening the respectively preceding pulse of the pulsed sinusoidal signal with pulse pauses eliminated at its end until the phase at the beginning of the respectively following pulse agrees with the phase at the end of the respectively preceding pulse, so that an instability at the transition between two respectively following pulses of a pulsed sinusoidal signal with pulse pauses eliminated no longer occurs. A phase-noise spectrum with pulse pauses eliminated and free from instabilities at the transitions between successive pulses also contains no Dirac impulses.

In order to remove additional phase-noise which arises in the test signal processing chain and is superposed over the phase-noise of the pulsed sinusoidal signal under test, the pulsed sinusoidal signal is split into a first pulsed sinusoidal signal and a second pulsed sinusoidal signal identical to the first pulsed sinusoidal signal. The first and second pulsed sinusoidal signal are each converted in a separate signal processing chain by analog-digital conversion, and mixed into the baseband by means of quadrature mixing. The respectively determined phases of the first and second pulsed sinusoidal signal in the baseband are cross-correlated and Fourier transformed. The result of the cross-correlation contains only the correlated payload-signal component and noise-signal component of the originally generated, pulsed sinusoidal signal in the first and respectively second pulsed baseband sinusoidal signal, while the non-correlated noise components in the first and respectively the second pulsed baseband sinusoidal signal, which occur in the two signal processing paths respectively, are removed.

In the following section, the embodiments and sub-embodiments of the method according to the invention and of the device according to the invention for measuring the phase-noise spectrum of a pulsed sinusoidal signal are explained in detail by way of example on the basis of the drawings. The drawings are as follows:

FIGS. 4A, 4B show a time-flow diagram with a pulsed sinusoidal signal and a frequency diagram with an associated spectrum;

FIGS. 5A, 5B show a time-flow diagram with a first sub-embodiment of a pulsed sinusoidal signal with pulse pauses eliminated according to the invention and a frequency diagram with an associated spectrum;

FIGS. 6A, 6B show a time-flow diagram with a second sub-embodiment of a pulsed sinusoidal signal with pulse pauses eliminated according to the invention and a frequency diagram with an associated spectrum;

Figure 1:
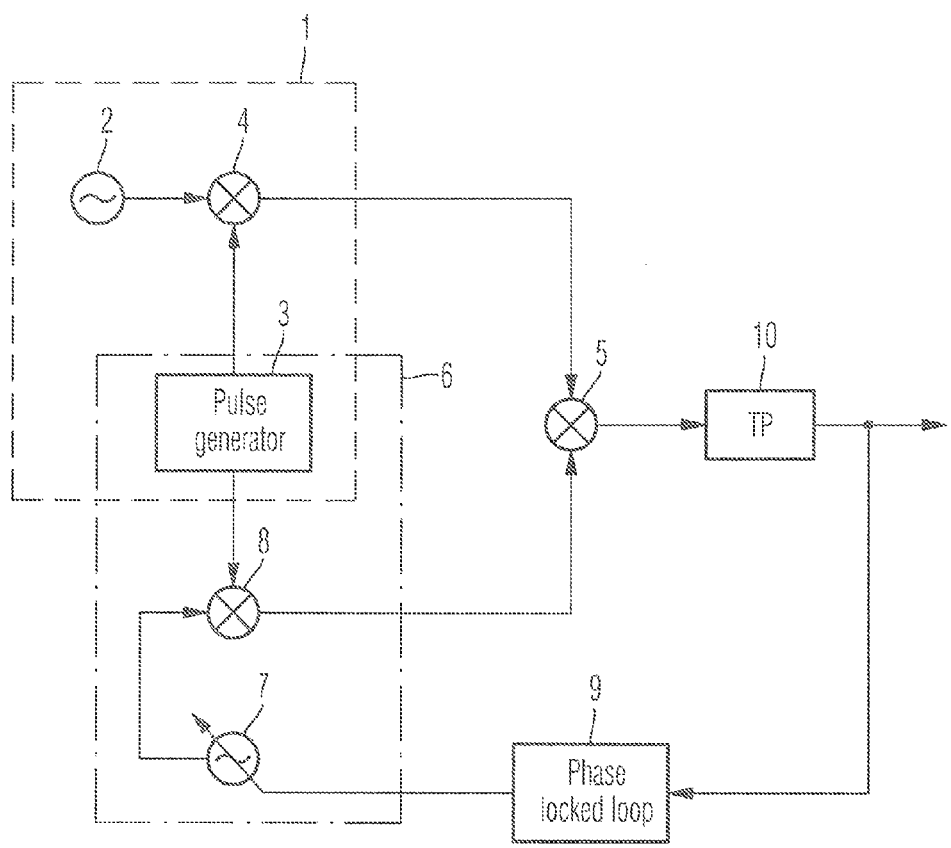
FIG. 1 shows a block-circuit diagram of a device previously used internally by the applicant for measuring the phase-noise spectrum of a pulsed sinusoidal signal.

In the following section the first embodiment of the device according to the invention is explained on the basis of the block-circuit diagram in FIG. 2A, and the first embodiment of the method according to the invention is explained on the basis of the flow diagram in FIG. 7A.

In the first method step S10, a pulsed sinusoidal signal is generated in a signal source 1 according to FIG. 4A. For this purpose, a high-frequency sinusoidal signal is generated in an oscillator 2. This high-frequency sinusoidal signal is then modulated in a pulse modulator 4 with a relatively lower-frequency pulsed signal generated in a pulse generator 3 (corresponds to the dotted-line signal course in FIG. 4A) in order to generate the pulsed sinusoidal signal.

In the next method step S20, the pulsed sinusoidal signal is matched in an amplifier 11 with regard to its signal level to the input signal-level range of a downstream analog-digital converter 12. Additionally, in method step S20, a low pass filtering of the pulsed sinusoidal signal is implemented in a low-pass filter 13. The low-pass filtering brings about a band limitation of the pulsed sinusoidal signal matched to the sampling frequency of the downstream analog-digital converter in order to avoid aliasing in the spectrum of the digital pulsed sinusoidal signal.

In the next method step S30, the high-frequency pulsed sinusoidal signal is mixed into an intermediate frequency position. For this purpose, the high-frequency pulsed sinusoidal signal is mixed in a mixer 14 with a mixer signal generated in a local oscillator 15. The mixing of the pulsed sinusoidal signal into the intermediate frequency position can be dispensed with if the pulsed sinusoidal signal is already disposed in an (intermediate) frequency position in which an analog-digital conversion can already be implemented or is meaningful.

The next method step S40 contains the analog-digital conversion of the analog, pulsed sinusoidal signal into a corresponding, digital, pulsed sinusoidal signal in an analog-digital converter 12 in the intermediate frequency band.

In the next method step S50, a quadrature mixing of the digital pulsed sinusoidal signal from the intermediate frequency band into the baseband is implemented by means of a quadrature mixer 16. The quadrature mixer 16 supplies both Cartesian components—in-phase component I and quadrature component Q—of a complex pulsed sinusoidal signal in the baseband.

The next method step S60 implements the removal according to the invention of pulse pauses in the pulsed sinusoidal signal in the baseband by means of a unit 27 for the removal of pulse pauses from the pulsed sinusoidal signal. For this purpose, the time intervals of the pulse pauses are identified on the basis of a threshold-value comparison of the sample-values of the in-phase and quadrature components of the complex pulsed sinusoidal signal in the baseband with an appropriately selected threshold value by a unit 17 for combining signal values occurring in pulses associated with the unit 27 for the removal of pulse pauses from the pulsed sinusoidal signal, and only the sampled values of the in-phase and quadrature components of the complex pulsed sinusoidal signal in the baseband occurring in the pulses are stored in a ring buffer 18 associated with the unit 27 for the removal of pulse pauses from the pulsed sinusoidal signal.

In this manner, the sampled values of the in-phase component I and of the quadrature component Q of the complex pulsed sinusoidal signal in the baseband are arranged successively in rows in the ring buffer 18 in the individual successive phases of a pulse without gaps and therefore without pulse pause. The reading out of the sampled values of the in-phase component I' and of the quadrature component Q' of the complex pulsed sinusoidal signal in the baseband arranged successively in rows without pulse pause is implemented with an appropriately selected sampling frequency.

In a first sub-embodiment of the removal of pulse pauses from the pulsed sinusoidal signal u(t) according to the invention, the individual pulses of the pulsed sinusoidal signal according to FIG. 5A are combined directly without shortening the pulses to form a pulsed sinusoidal signal with pulse pauses eliminated. In this context, it can occur that the phase of the respectively preceding pulse does not agree with the phase of the respectively following pulse in the pulsed sinusoidal signal u(t)' with pulse pauses eliminated, and an instability occurs in the signal course of the pulsed sinusoidal signal u(t)' with pulse pauses eliminated. In the associated spectrum U(f)' in FIG. 5B, these instabilities occurring periodically in a cycle of one pulse duration in the signal course of the pulsed sinusoidal signal u(t)' with pulse pauses eliminated lead to a Dirac impulse 20 with the frequency of the periodicity of the successively arranged pulses. Alongside the Dirac impulse 20 attributable to the instabilities, the spectral lines 19 at the frequency of the sinusoidal signal attributable to the sinusoidal signal, and the noise spectrum of the noise-signal component superposed on the pulsed sinusoidal signal are recognisable in the spectrum U(f)' of the pulsed sinusoidal signal u(t)' with pulse pauses eliminated.

In a second sub-embodiment of the removal of pulse pauses from the pulsed sinusoidal signal u(t) according to the invention, the respectively following pulses of the pulsed sinusoidal signal in the baseband at the beginning of the pulse are shortened in a functional unit not illustrated in FIG. 2 until the phase of the respectively preceding pulse agrees with the phase of the respectively following pulse in the pulsed sinusoidal signal u(t)" with pulse pauses eliminated, and, as shown in FIG. 6A, an instability in the signal course of the pulsed sinusoidal signal u(t)" with pulse pauses eliminated does not occur. Only the spectral line 19 attributable to the sinusoidal signal at the frequency of the sinusoidal signal and the noise spectrum of the noise signal component superposed over the pulsed sinusoidal signal are now still contained in the associated spectrum U(f)' in FIG. 6B.

Instead of ring buffers, other functional units and other method mechanisms can be used for the removal of pulse pauses from the complex pulsed sinusoidal signal in the baseband and are also covered by the invention.

In the next method step S70, the in-phase component I' and the quadrature component Q' of the pulsed sinusoidal signal u(t)' and respectively u(t)" with pulse pauses eliminated in the baseband are supplied to a unit 18 for determining the phase of the pulsed sinusoidal signal in the baseband, which is preferably realised as a Coordinate Rotation Digital Computer (Cordic) module. This Cordic module determines from the Cartesian coordinates—in-phase component I' and quadrature component Q'—of the complex pulsed sinusoidal signal u(t)' and respectively u(t)" with pulse pauses eliminated in the baseband, the associated polar coordinates—phase φ and amplitude r—of the complex pulsed sinusoidal signal u(t)' and respectively u(t)" with pulse pauses eliminated in the baseband. In order to determine the phase-noise spectrum, the amplitude r determined by the Cordic module of the complex pulsed sinusoidal signal u(t)' and respectively u(t)" with pulse pauses eliminated in the baseband is irrelevant and can be used for the optional determination of the amplitude-noise spectrum.

In the next method step S80, the determined phase φ of the complex pulsed signal u(t)' and respectively u(t)" with pulse pauses eliminated in the baseband is supplied to a Fast Fourier Transformer (FTT) for the determination of the corresponding phase spectrum.

Finally, in a final method step S90, in order to obtain the phase-noise spectrum of the complex pulsed sinusoidal signal u(t)' and respectively u(t)" with pulse pauses eliminated in the baseband, the phase-spectral components associated with the sinusoidal payload-signal component, that is, the spectral lines disposed respectively at the positive and negative frequency of the sinusoidal signal, are removed from the determined phase spectrum. With a frequency constancy of the sinusoidal signal which is not exact and known, the frequency position of the spectral lines associated with the sinusoidal signal is identified, for example, by means of a threshold-value detector, which is not illustrated in FIG. 2; or is already known in the case of an exact frequency constancy of the sinusoidal signal. The removal of the spectral lines in the determined or known frequency position is implemented in an interpolator 21 with interpolation of the respectively adjacent spectral values of the phase spectrum and replacement of the spectral value of the spectral line with the determined interpolation value.

Additionally, in this method step S90, the Dirac impulses contained in the spectrum in the case of the first sub-embodiment of the removal of pulse pauses from the pulsed sinusoidal signal u(t) according to the invention are removed by interpolation of the spectral values respectively adjacent to each Dirac impulse and replacement of the spectral value of each Dirac impulse with the determined interpolation value.

Figure 2A:
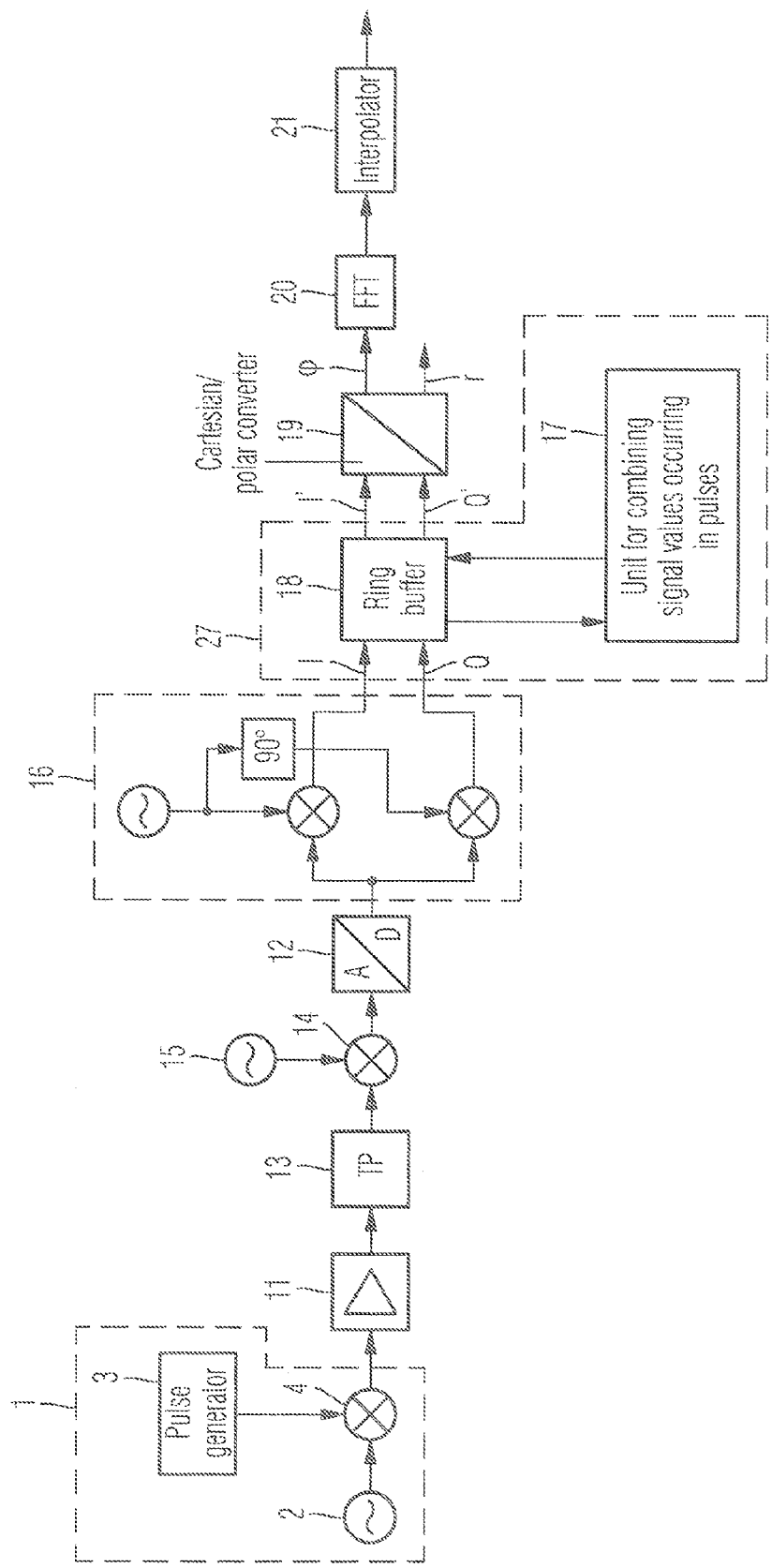
FIG. 2A shows a block-circuit diagram of a first embodiment of a device according to the invention for measuring the phase-noise spectrum of a pulsed sinusoidal signal.
Figure 2B:
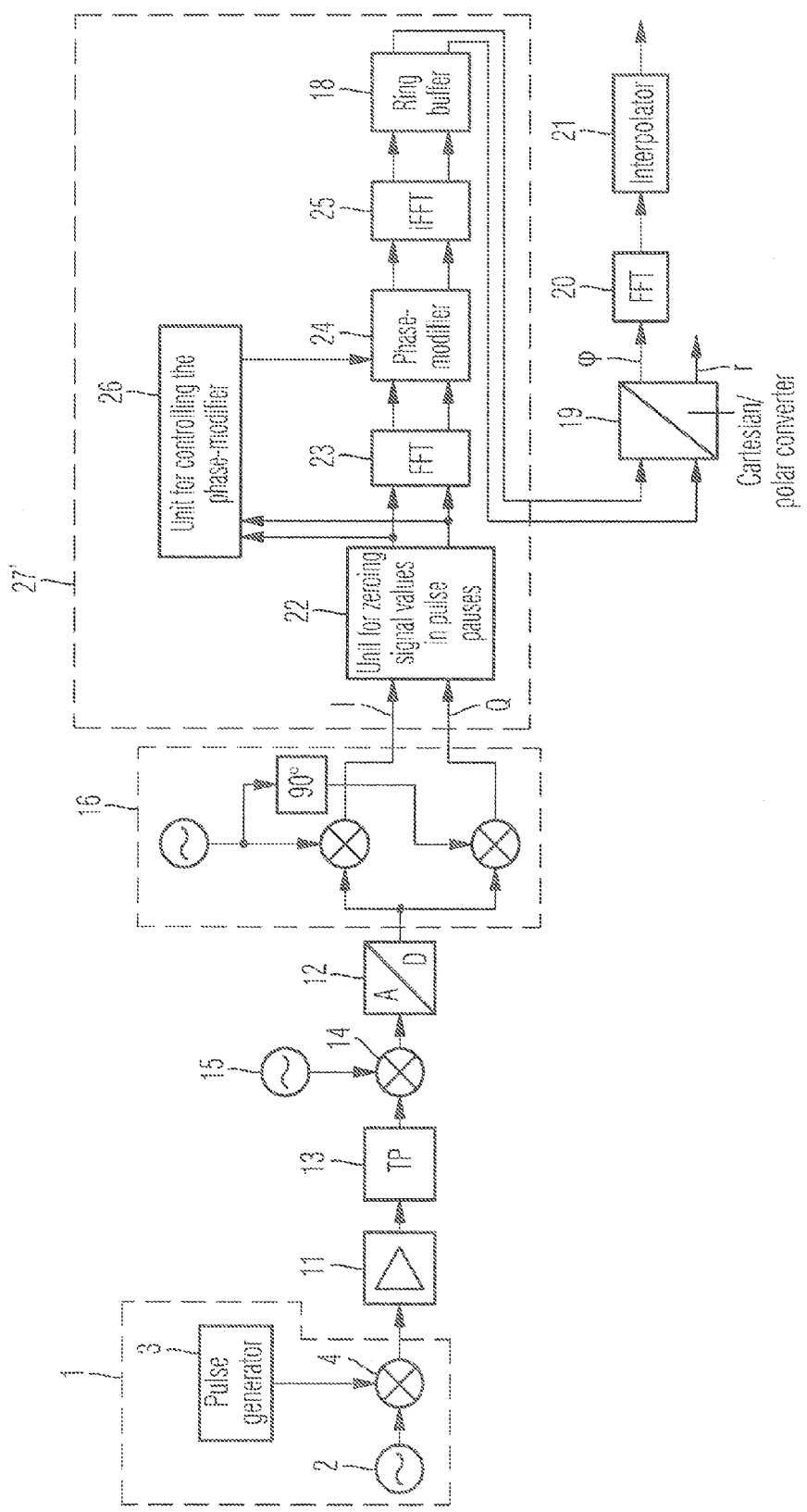
FIG. 2B shows a block-circuit diagram of a second embodiment of a device according to the invention for measuring the phase-noise spectrum of a pulsed sinusoidal signal.
Figure 7A:
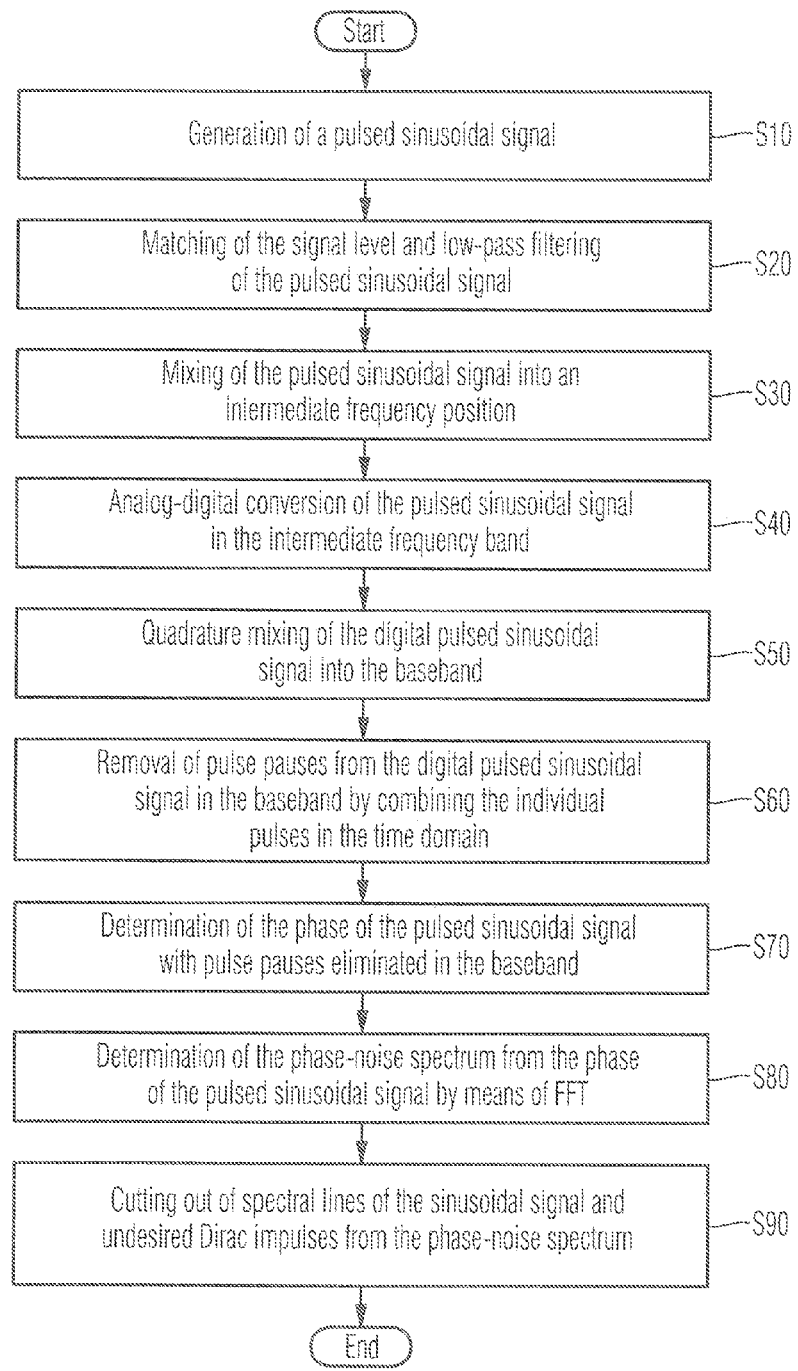
FIG. 7A shows a flow diagram of a first embodiment of a method according to the invention for measuring the phase-noise spectrum of a pulsed sinusoidal signal.
Figure 7B:
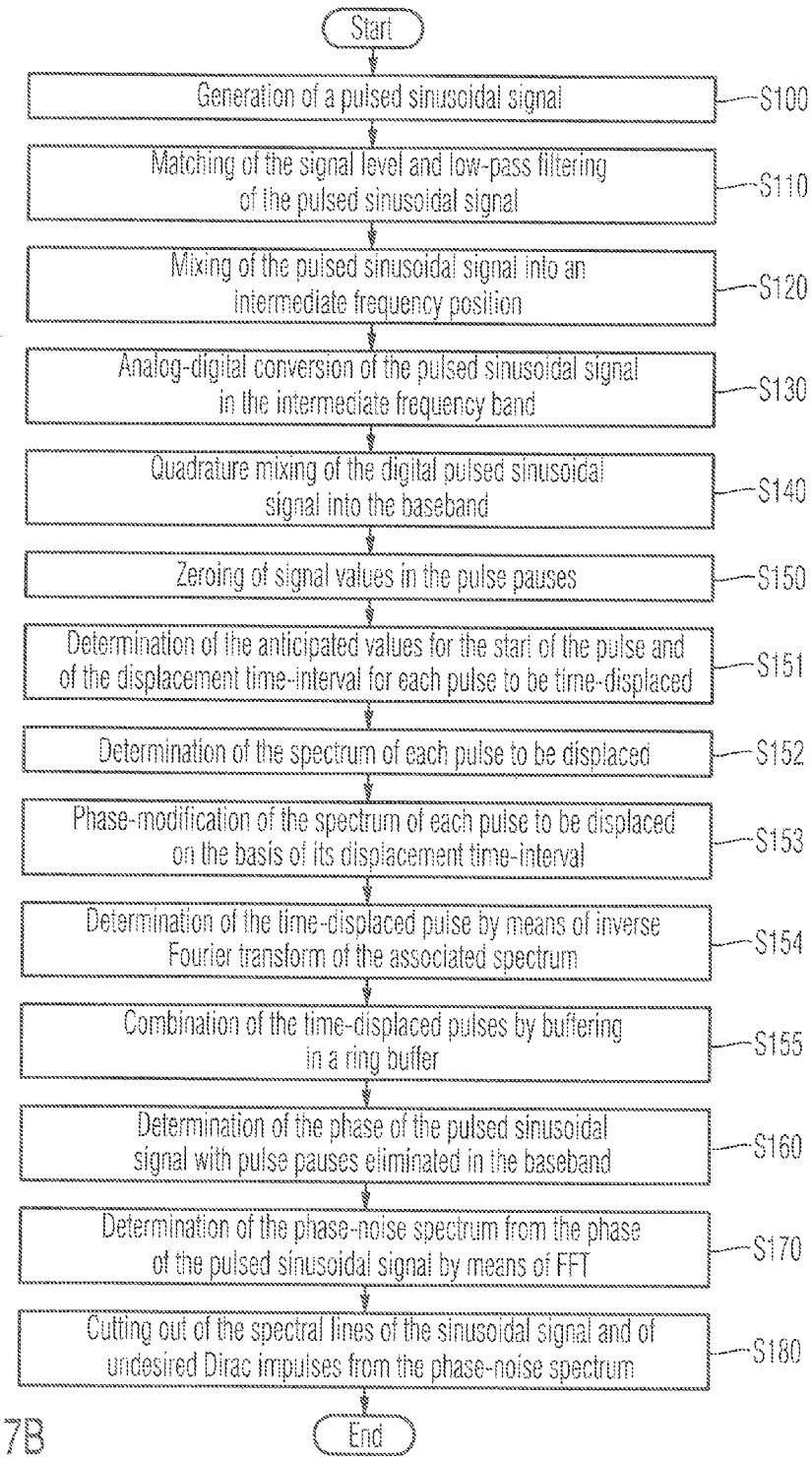
FIG. 7B shows a flow diagram of a second embodiment of a method according to the invention for measuring the phase-noise spectrum of a pulsed sinusoidal signal.

In the following section, the second embodiment of the device according to the invention is explained on the basis of the block-circuit diagram in FIG. 2B, and the second embodiment of the method according to the invention is explained on the basis of the flow diagram in FIG. 7B:

The first method steps S100 to S140 of the second embodiment of the method according to the invention in FIG. 7B and the associated functional units of the second embodiment of the device according to the invention in FIG. 2B correspond to the method steps S10 to S50 of the first embodiment of the method according to the invention in FIG. 7A and the associated functional units of the first embodiment of the device according to the invention in FIG. 2A, and a further description will therefore not be provided.

In the next method step S150, in order to zero signal levels in pulse pauses, the sampled values occurring in the pulse pauses, which do not disappear as a result of an occurring noise, are set to zero in a unit 22 associated with the unit 27' for the removal of pulse pauses from the pulsed sinusoidal signal. The start and the end of the individual pulse pauses of the complex digital pulsed sinusoidal signal in the baseband can be determined in an equivalent manner to the first embodiment of the invention by threshold-value comparison of the sampled values of the complex digital pulsed sinusoidal signal with an appropriately selected threshold value.

In the next method step S151, the anticipated values for the start of every pulse to be time-displaced in the complex pulsed sinusoidal signal in the baseband are determined by a unit 26 associated with the unit 27' for the removal of pulse pauses from the pulsed sinusoidal signal in order to control the phase modifier, and on this basis, the displacement time-interval of every individual pulse to be displaced is determined at the new start of the pulse after the time displacement.

In the next method step S152, on the basis of the determined anticipated values for the start of each individual pulse to be displaced, the sampled values of the complex pulsed sinusoidal signal in the baseband in a time interval, which extends, according to FIG. 2, over the entire pulse length of the respective pulse, with the addition of a given time interval extending respectively before and after the respective pulse (see time range presented with dotted line in FIG. 3), are transformed into the spectral domain by a downstream fast Fourier transformer 23 associated with the unit 27' for the removal of pulse pauses from the pulsed sinusoidal signal or respectively by another appropriate spectral transformer, in each case, for every individual pulse of the digital complex pulsed sinusoidal signal in the baseband.

In the next method step S153, the spectrum of the respective pulse of the digital complex pulsed sinusoidal signal in the baseband is phase-displaced by a downstream phase modifier 24 associated with the unit 27' for the removal of pulse pauses from the pulsed sinusoidal signal by a frequency-dependent phase angle, which, subject to the displacement law of the spectral transformation according to the transformation condition in equation (1), corresponds to the displacement time interval $T_i$ determined in method step S151 of the respective pulse i.

$$u(t-T_i) \leftrightarrow e^{-j2\pi T_i f} \cdot U(f) \quad (1)$$

In the next method step S154, the phase-displaced spectrum respectively associated with each individual pulse of the digital complex pulsed sinusoidal signal in the baseband is transformed into the time domain in a downstream inverse fast Fourier transformer 25 associated with the unit 27' for the removal of pulse pauses from the pulsed sinusoidal signal in order to generate a time-displaced pulse. A frequency range which extends over all spectral values of the spectrum associated with the respective pulse with the addition of a frequency range preceding and following this spectrum is used for the re-transformation back into the time domain.

In the next method step S155, the sampled values different from zero of the respective time-displaced pulse of the digital complex pulsed sinusoidal signal in the baseband are cut out from the determined result of the re-transformation and stored successively in a ring buffer 18 associated with the unit 27' for the removal of pulse pauses from the pulsed sinusoidal signal in order to combine the sampled values of the individual pulses of the digital complex pulsed sinusoidal signal in the baseband.

The last method steps S160 to S180 of the second embodiment of the method according to the invention in FIG. 7B and of the associated functional units of the second embodiment of the device according to the invention in FIG. 2B correspond to the method steps S70 to S90 of the first embodiment of the method according to the invention in FIG. 7A and the associated functional units of the first embodiment of the device according to the invention in FIG. 2A, and a further description will therefore not provided here.

Figure 2C:
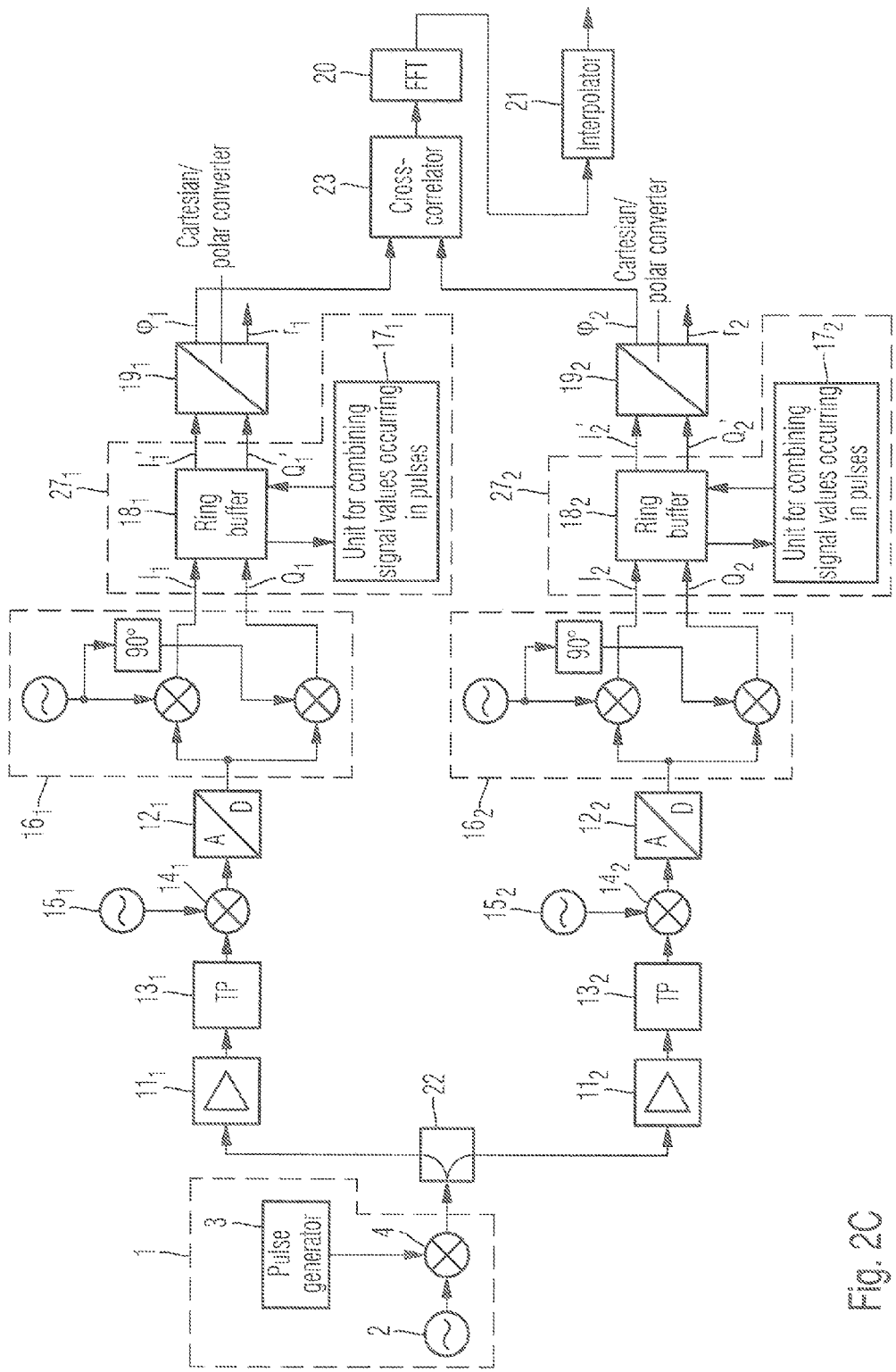
FIG. 2C shows a block-circuit diagram of a third embodiment of a device according to the invention for measuring the phase-noise spectrum of a pulsed sinusoidal signal.
Figure 3:
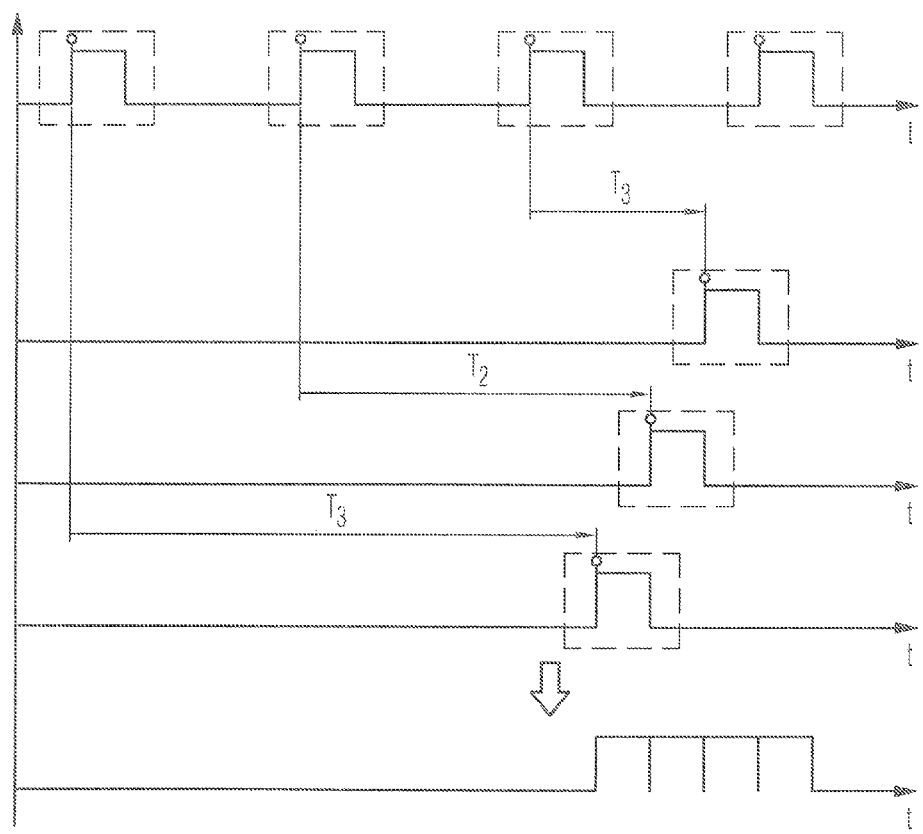
FIG. 3 shows a time-flow diagram of the time-displaced pulses of the pulsed sinusoidal signal corresponding to the second embodiment of the invention.
Figure 7C:
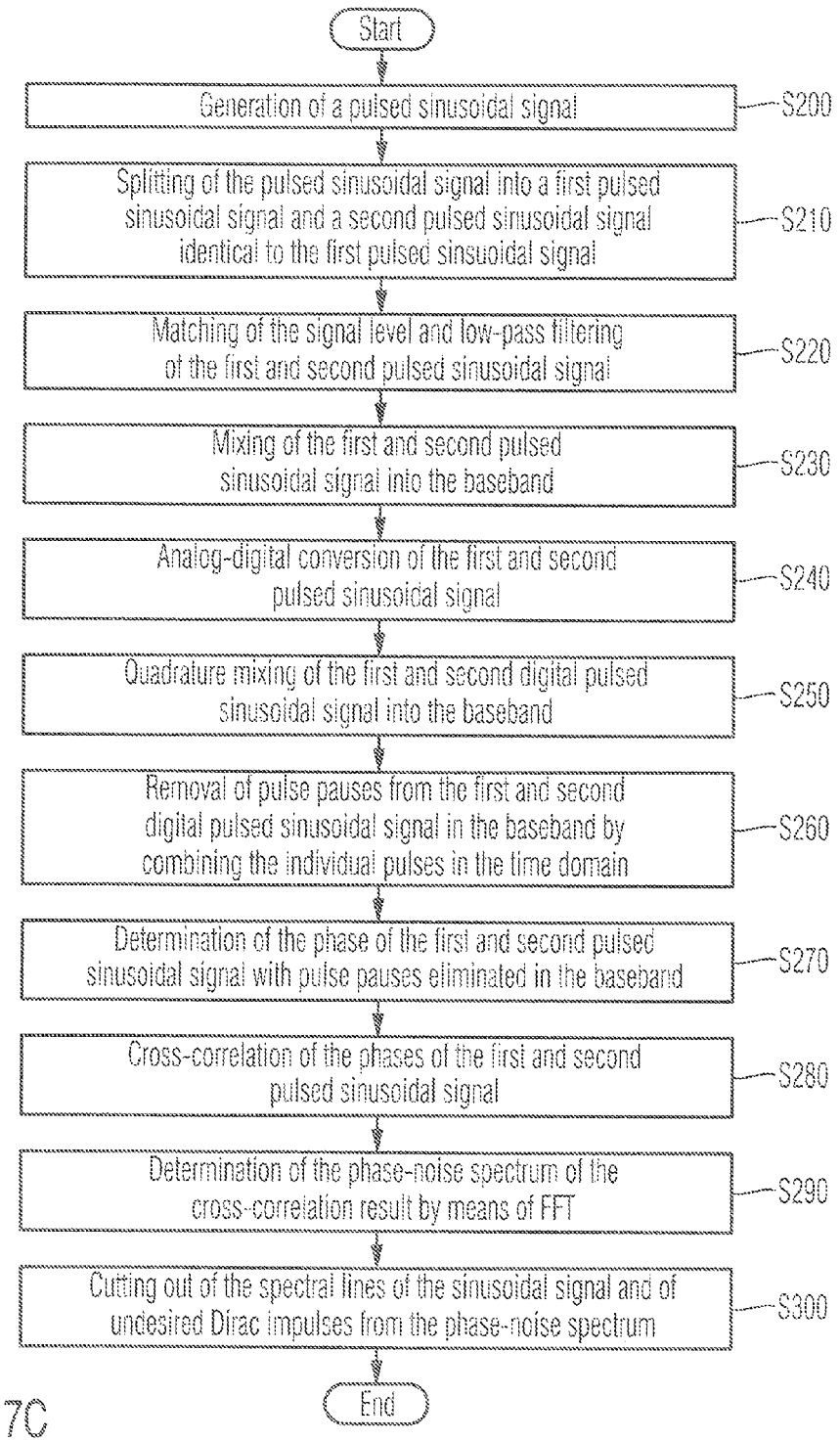
FIG. 7C shows a flow diagram of a third embodiment of a method according to the invention for measuring the phase-noise spectrum of a pulsed sinusoidal signal.

In the following section, the third embodiment of the device according to the invention is explained on the basis of the block-circuit diagram in FIG. 2C, and the third embodiment of the method according to the invention is explained on the basis of the flow diagram in FIG. 7C:

In the first method step S200, by analogy with method step S10 of the first embodiment of the method according to the invention, a pulsed sinusoidal signal is generated in a signal source 1. In the next method step S210, this pulsed sinusoidal signal is split into a first pulsed sinusoidal signal and a second pulsed sinusoidal signal identical to the first pulsed sinusoidal signal.

In the next method step S220, by analogy with method step S20 of the first embodiment of the method according to the invention, a signal-level matching of the first pulsed sinusoidal signal to the input signal-level range of a downstream analog-digital converter $12_1$ is implemented in an amplifier $11_1$, and a signal-level matching of the second pulsed sinusoidal signal to the input signal-level range of a downstream analog-digital converter $12_2$ is implemented in an amplifier $11_2$. Additionally, a low-pass filtering in a low pass filter $13_1$ for the first pulsed sinusoidal signal and in a low pass filter $13_2$ for the second pulsed sinusoidal signal is implemented in order to avoid aliasing in the associated spectrum of the digitised first and respectively second pulsed sinusoidal signal after the analog-digital conversion.

In the next method step S230, by analogy with method step S30 of the first embodiment of the method according to the invention, the first pulsed sinusoidal signal is mixed in a mixer $14_1$ with a mixer signal generated in an associated local oscillator $15_1$, and the second pulsed sinusoidal signal is mixed in a mixer $14_2$ with a mixer signal generated in an associated local oscillator $15_2$, in each case into an intermediate frequency position.

In the next method step S240, by analogy with method step S40 of the first embodiment of the method according to the invention, the analog-digital conversion of the first pulsed signal by means of an analog-digital converter $12_1$ and the analog-digital conversion of the second pulsed signal by means of an analog-digital converter $12_2$ is implemented in the intermediate frequency band.

In the following method step S250, by analogy with method step S50 of the first embodiment of the method according to the invention, the digital first pulsed sinusoidal signal is mixed by means of a quadrature mixer $16_1$, and the digital second pulsed sinusoidal signal is mixed by means of a quadrature mixer $16_2$, in each case from the intermediate frequency band into the baseband.

By analogy with method step S60 of the first embodiment of the method according to the invention, the next method step S260 provides the removal of pulse pauses from the digital first and respectively second complex pulsed sinusoidal signal in the baseband. For this purpose, on the basis of a threshold-value comparison of the sampled values of the in-phase and quadrature components of the first complex pulsed sinusoidal signal in the baseband, the time intervals of the pulse pauses with an appropriately selected threshold value are identified by a first unit $17_1$ associated with the first unit $27_1$ for the removal of pulse pauses from the pulsed sinusoidal signal for combining signal values occurring in pulses, and only the sampled values occurring in the pulses of the in-phase and quadrature components of the first complex pulsed sinusoidal signal in the baseband are stored in a first ring buffer $18_1$ associated with the first unit $27_1$ for the removal of pulse pauses from the pulsed sinusoidal signal. By analogy, on the basis of a threshold-value comparison of sampled values of the in-phase and quadrature components of the second complex pulsed sinusoidal signal in the baseband, the time intervals of the pulse pauses with an appropriately selected threshold value are identified by a second unit $17_2$ associated with the second unit $27_2$ for the removal of pulse pauses from the pulsed sinusoidal signal for combining signal values occurring in pulses, and only the sampled values occurring in the pulses of the in-phase and quadrature components of the second complex pulsed sinusoidal signal in the baseband are stored in a second ring buffer $18_2$ associated with the second unit $27_2$ for the removal of pulse pauses from the pulsed sinusoidal signal.

In the first ring buffer $18_2$, Cartesian components with pulse pauses eliminated—in-phase components $I_1'$ and quadrature components $Q_1'$—of the digital complex first pulsed sinusoidal signal are prepared from the Cartesian components—in-phase component $I_1$ and quadrature component $Q_1$—of the digital complex first pulsed sinusoidal signal. By analogy, Cartesian components with pulse pauses eliminated—in-phase components $I_2'$ and quadrature or components $Q_2'$—of the digital complex second pulsed sinusoidal signal are prepared from the Cartesian components—$I_2$ and quadrature components $Q_2$—of the digital complex second pulsed sinusoidal signal in the second ring buffer $18_2$.

In the next method step S270, by analogy with method step S70 of the first embodiment of the method according to the invention, the phase $\phi_1$ of the first complex pulsed sinusoidal signal in the baseband is determined in a unit $18_1$ for determining the phase of the pulsed sinusoidal signal from the associated Cartesian components—in-phase component $I_1'$ and quadrature component $Q_1'$—of the complex first pulsed sinusoidal signal with pulse pauses eliminated, and the phase $\phi_2$ of the second complex pulsed sinusoidal signal in the baseband is determined in a unit $18_2$ for determining the phase of the pulsed sinusoidal signal from the associated Cartesian components—in-phase component $I_2'$ and quadrature component $Q_2'$—of the complex second pulsed sinusoidal signal with pulse pauses eliminated.

In the next method step S280, the phase $\phi_1$ determined in the preceding method step S270 of the first complex pulsed sinusoidal signal with pulse pauses eliminated is cross-correlated with the phase $\phi_2$ of the second complex pulsed sinusoidal signal with pulse pauses eliminated in the baseband in a cross-correlator 23. The mutually non-coherent noise-signal components, which are generated in the two test signal paths from the distributor 22 to the units $18_1$ and respectively $18_2$ for determining the phase of the pulsed sinusoidal signal, and which are additionally superposed over the first and respectively second pulsed sinusoidal signal and disadvantageously contaminate the latter, no longer occur in the result of the cross-correlation.

In the next method step S290, the phase spectrum of the digital pulsed sinusoidal signal in the baseband is determined by means of Fourier transform of the correlation result in a fast Fourier transformer 20.

In the final method step S300, by analogy with method step S90 of the first embodiment of the method according to the invention, the spectral lines associated with the sinusoidal payload-signal component and the Dirac impulses, which result from the instabilities in the signal course of the first and respectively second complex pulsed sinusoidal signal with pulse pauses eliminated, are removed in an interpolator 21 in order to determine the pure phase-noise spectrum of the pulsed sinusoidal signal.

The invention is not restricted to the embodiments and sub-embodiments presented. Within the scope of the invention, all of the features claimed and/or illustrated can be combined with one another as required. In particular, a combination of the second and third embodiment of the invention in which the removal of pulse pauses from the pulsed sinusoidal signal is implemented in a cross-correlator by means of phase displacement of the spectra associated with the individual pulses of the pulsed sinusoidal signal is also covered.

The invention claimed is:

1. A method for measuring the phase-noise spectrum of a pulsed sinusoidal signal with the following method steps:
   generating a pulsed digital sinusoidal signal,
   quadrature mixing the pulsed sinusoidal signal into the baseband,
   determining the phase of the pulsed sinusoidal signal in the baseband,
   determining the phase spectrum of the pulsed sinusoidal signal by means of Fourier transform of the phase of the pulsed sinusoidal signal in the baseband,
   determining the phase-noise spectrum of the pulsed sinusoidal signal by removing the spectral lines associated with the sinusoidal signal from the phase spectrum,
   wherein the pulse pauses are also removed from the pulsed sinusoidal signal in the baseband.

2. The method according to claim 1,
   wherein
   the removal of pulse pauses from the pulsed sinusoidal signal by cutting out the pulse pauses from the pulsed sinusoidal signal is implemented in the time domain.

3. The method according to claim 1,
   wherein
   the removal of pulse pauses from the pulsed sinusoidal signal comprises the following method steps to be implemented iteratively:
   zeroing signal values in the pulse pauses of the pulsed sinusoidal signal,
   determining an anticipated value for the start of the pulse and of a displacement time-interval for every pulse of the pulsed sinusoidal signal to be time-displaced,
   determining a spectrum associated with each pulse,
   displacing the phase of the respective spectrum corresponding to the displacement time-interval of the respective pulse and
   determining the respective time-displaced pulse by means of inverse Fourier transform of the phase-displaced spectrum associated with the respective pulse and
   buffering the respective time-displaced pulse.

4. The method according to claim 1,
   wherein
   the generated, pulsed sinusoidal signal is split into a first pulsed sinusoidal signal and a second pulsed sinusoidal signal identical to the first pulsed sinusoidal signal, the method steps of the quadrature mixing, removal of the pulse pauses and determination of the phase are each implemented separately for the first and second pulsed sinusoidal signal, and the phase spectrum of the pulsed sinusoidal signal is determined by means of cross-correlation and subsequent Fourier transform of the phase of the first and second pulsed sinusoidal signal in the baseband.

5. The method according to claim 1,
   wherein
   the Dirac impulses occurring in the phase-noise spectrum, which result from instabilities in the course of the phase of the pulsed sinusoidal signal with pulse pauses eliminated or of the first pulsed sinusoidal signal with pulse pauses eliminated or of the second pulsed sinusoidal signal with pulse pauses eliminated, are identified and removed from the phase-noise spectrum by interpolation with adjacent spectral values of the phase-noise spectrum.

6. The method according to claim 1,
   wherein
   an unsteadiness which occurs in the course of the phase of the pulsed sinusoidal signal with pulse pauses eliminated or the first pulsed sinusoidal signal with pulse pauses eliminated or the second pulsed sinusoidal signal with pulse pauses eliminated, is removed by shortening the respectively following pause of the pulsed sinusoidal signal or of the first pulsed sinusoidal signal or of the second pulsed sinusoidal signal until the phase in the respectively preceding pulse of the pulsed sinusoidal signal or of the first pulsed sinusoidal signal or of the second pulsed sinusoidal signal corresponds to the phase in the respectively following pulse of the pulsed sinusoidal signal or of the first pulsed sinusoidal signal or of the second pulsed sinusoidal signal.

7. A device for measuring the phase-noise spectrum of a pulsed sinusoidal signal comprising:
 a signal source configured to generate the pulsed sinusoidal signal,
 at least one analog-digital converter for the analog-digital conversion of the pulsed sinusoidal signal,
 at least one quadrature mixer for the quadrature mixing of the pulsed sinusoidal signal into the baseband,
 at least one unit configured to determine the phase of the pulsed sinusoidal signal,
 a Fourier transformer configured to determine the phase spectrum of the pulsed sinusoidal signal from the phase of the pulsed sinusoidal signal,
 an interpolator configured to determine the phase-noise spectrum of the pulsed sinusoidal signal by cutting out spectral lines associated with the sinusoidal signal from the phase spectrum,
 wherein a unit configured to remove pulse pauses from the pulsed sinusoidal signal is arranged upstream of the Fourier transformer.

8. The device according to claim 7,
 wherein
 the unit configured to remove pulse pauses from the pulsed sinusoidal signal provides a ring buffer.

9. The device according to claim 8,
 wherein
 a unit configured to combine signal values occurring in pulses is connected to the ring buffer.

10. The device according to claim 7,
 wherein
 the unit configured to remove pulse pauses from the pulsed sinusoidal signal provides a unit configured to zero signal values occurring in pulse pauses, a unit configured to control a phase modifier, a Fourier transformer configured to determine the spectrum associated with each pulse, a phase modifier configured to displace the phase of the respective spectrum, an inverse Fourier transformer configured to determine the time-displaced pulse associated with the respective phase-displaced spectrum and a ring buffer configured to buffer the individual time-displaced pulses.

11. The device according to claim 7,
 wherein
 a splitter is connected between the signal source and the two analog-digital converters, and a cross-correlator is connected between the two units configured to determine the phase of the pulsed sinusoidal signal and the Fourier transformer.

12. The device according to claim 7,
 wherein
 the interpolator additionally serves to cut out Dirac impulses in the phase-noise spectrum.

* * * * *